US012640558B2

(12) United States Patent
Chang et al.

(10) Patent No.: US 12,640,558 B2
(45) Date of Patent: May 26, 2026

(54) FAILSAFE INPUT/OUTPUT ELECTROSTATIC DISCHARGE PROTECTION WITH DIODES

(71) Applicant: Taiwan Semiconductor Manufacturing Company, Ltd., Hsinchu (TW)

(72) Inventors: Tzu-Heng Chang, New Taipei City (TW); Hsin-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 227 days.

(21) Appl. No.: 18/515,580

(22) Filed: Nov. 21, 2023

(65) Prior Publication Data

US 2024/0088651 A1     Mar. 14, 2024

Related U.S. Application Data

(63) Continuation of application No. 17/484,086, filed on Sep. 24, 2021, now Pat. No. 11,870,247.

(60) Provisional application No. 63/160,049, filed on Mar. 12, 2021.

(51) Int. Cl.
   *H02H 9/04*      (2006.01)
   *H10D 89/60*     (2025.01)
(52) U.S. Cl.
   CPC ............ *H02H 9/046* (2013.01); *H10D 89/60* (2025.01)

(58) Field of Classification Search
   CPC .............................. H02H 9/046; H10D 89/60
   See application file for complete search history.

(56) References Cited

U.S. PATENT DOCUMENTS

| | | | |
|---|---|---|---|
| 6,556,399 B1 * | 4/2003 | Schoenfeld .......... | H10D 89/611 361/56 |
| 7,969,697 B2 * | 6/2011 | Farzan ................. | H10D 89/611 361/56 |
| 9,379,098 B2 | 6/2016 | Smith | |
| 2006/0050453 A1 | 3/2006 | Duvvury et al. | |
| 2010/0061027 A1 * | 3/2010 | Jiang ...................... | H02H 9/046 361/56 |
| 2013/0279051 A1 * | 10/2013 | Gill ......................... | H02H 9/041 361/56 |
| 2014/0035091 A1 * | 2/2014 | Smith ................... | H10D 89/611 257/499 |
| 2020/0194423 A1 | 6/2020 | Nandakumar et al. | |

* cited by examiner

*Primary Examiner* — Scott Bauer
(74) *Attorney, Agent, or Firm* — Jones Day

(57) ABSTRACT

Systems and methods are provided for fail-safe protection of circuitry from electrostatic discharge due through input and output connections. The power circuitry may include a string of diodes, connections to power lines, and particular diodes for voltage pull-up and pull-down clamping. There may be both a pull-up third diode in the diode string for connection between I/O and VDD and a pull-down third diode between I/O and VSS. During an ESD event the ESD device is configured to hold voltage from exceeding a threshold voltage and damaging internal circuitry. During operational mode the ESD device is turned off and does not interfere with circuit operations.

20 Claims, 13 Drawing Sheets

PS MODE

Separated Cells

PD MODE

1000

FAILSAFE INPUT/OUTPUT ELECTROSTATIC DISCHARGE PROTECTION WITH DIODES

CROSS-REFERENCE TO RELATED APPLICATIONS

This application is a continuation of U.S. patent application Ser. No. 17/484,086, filed Sep. 24, 2021, entitled "Failsafe Input/Output Electrostatic Discharge Protection with Diodes," which claims priority to U.S. Provisional Application No. 63/160,049, filed Mar. 12, 2021, entitled "Failsafe Electrostatic Discharge Protection with Diodes," each of which is incorporated herein by reference in their entirety.

TECHNICAL FIELD

The technology described in this patent document relates generally to power management systems and methods, and more particularly to electrostatic discharge (ESD) protection circuitry.

BACKGROUND

ESD is a sudden flow of electricity between electrically charged objects that may be caused by contact, an electrical short, dielectric breakdown, and others. If not properly controlled, ESD can damage the objects (e.g., integrated circuits) through which it flows and/or disrupt electrical communication signals. ESD events may occur due to static electricity, electrostatic induction, or other internal circuitry malfunction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
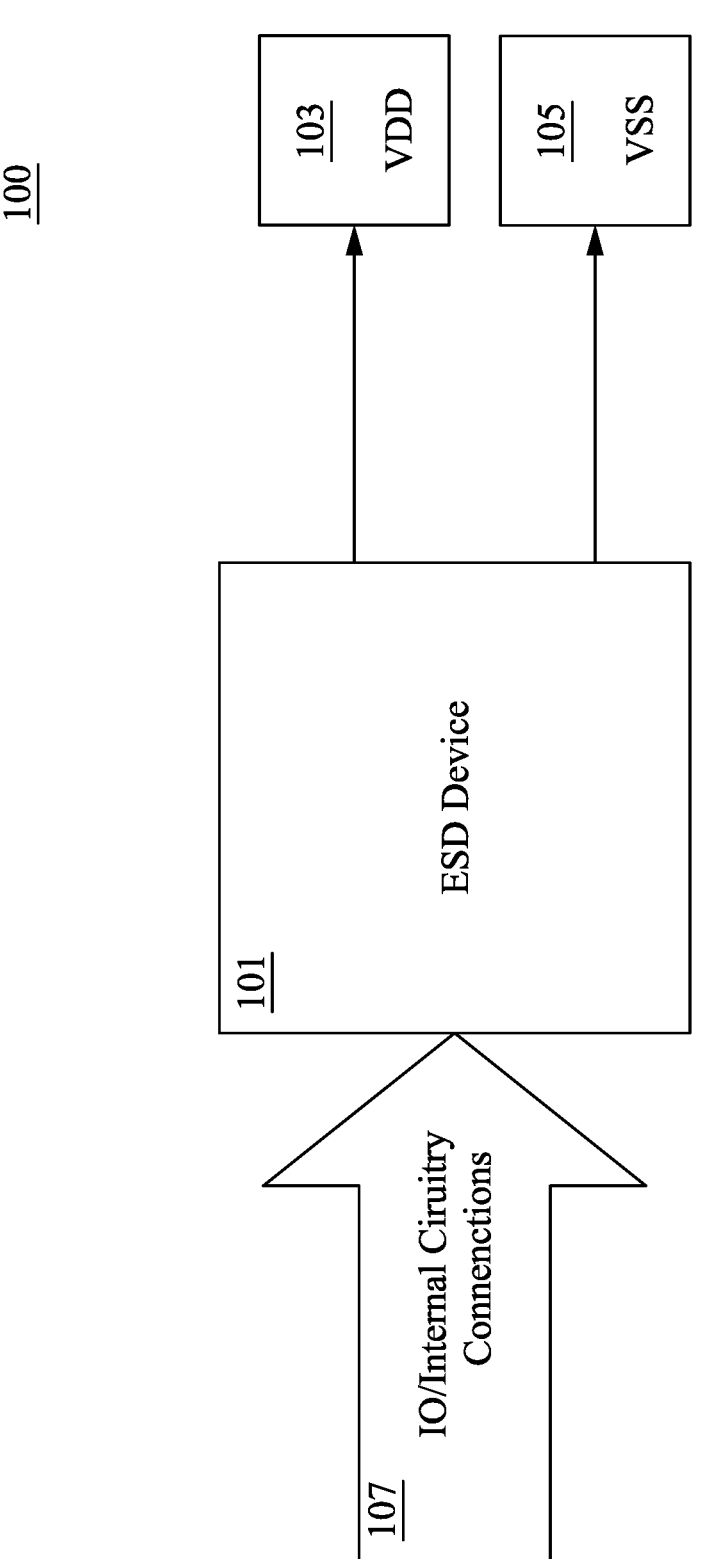
FIG. 1 is a block diagram depicting a power circuit that is configured to receive I/O and power supply connections in an embodiment.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

ESD can damage the circuitry through which it flows and/or disrupt electrical communication signals. ESD events may occur due to static electricity, electrostatic induction, or other internal circuitry malfunction. Systems and methods are provided herein for protecting internal circuitry from ESD events associated with input to the internal circuitry. One technique for protecting internal circuitry from ESD events is to connect a device in conjunction with circuitry to pull-down voltage and redirect power to power rails. These components for redirecting power to prevent unintended harms from ESD events are referred to as ESD devices.

FIG. 1 is a diagram depicting a power circuit 100 that is configured to receive circuitry Input/Output (I/O) connections, e.g., I/O pins 107 in an embodiment. An example ESD device 101 includes a plurality of input pins configured to receive current through internal circuitry connections 107 and connection to power supply lines. The connected power supply lines includes a positive voltage line 103 (VDD) and a ground or negative voltage line 105 (VSS). The ESD device 101 is off during normal operations of the internal circuitry. When voltage exceeds a threshold voltage the ESD device 101 operates such that current flows from the internal circuitry/IO pins 107, through the ESD device 101 to power lines VDD 103 or VSS 105. The ESD device 101 protects the internal circuitry by reducing the voltage at I/O pins 107 such that internal circuitry is not damaged.

Figure 2:
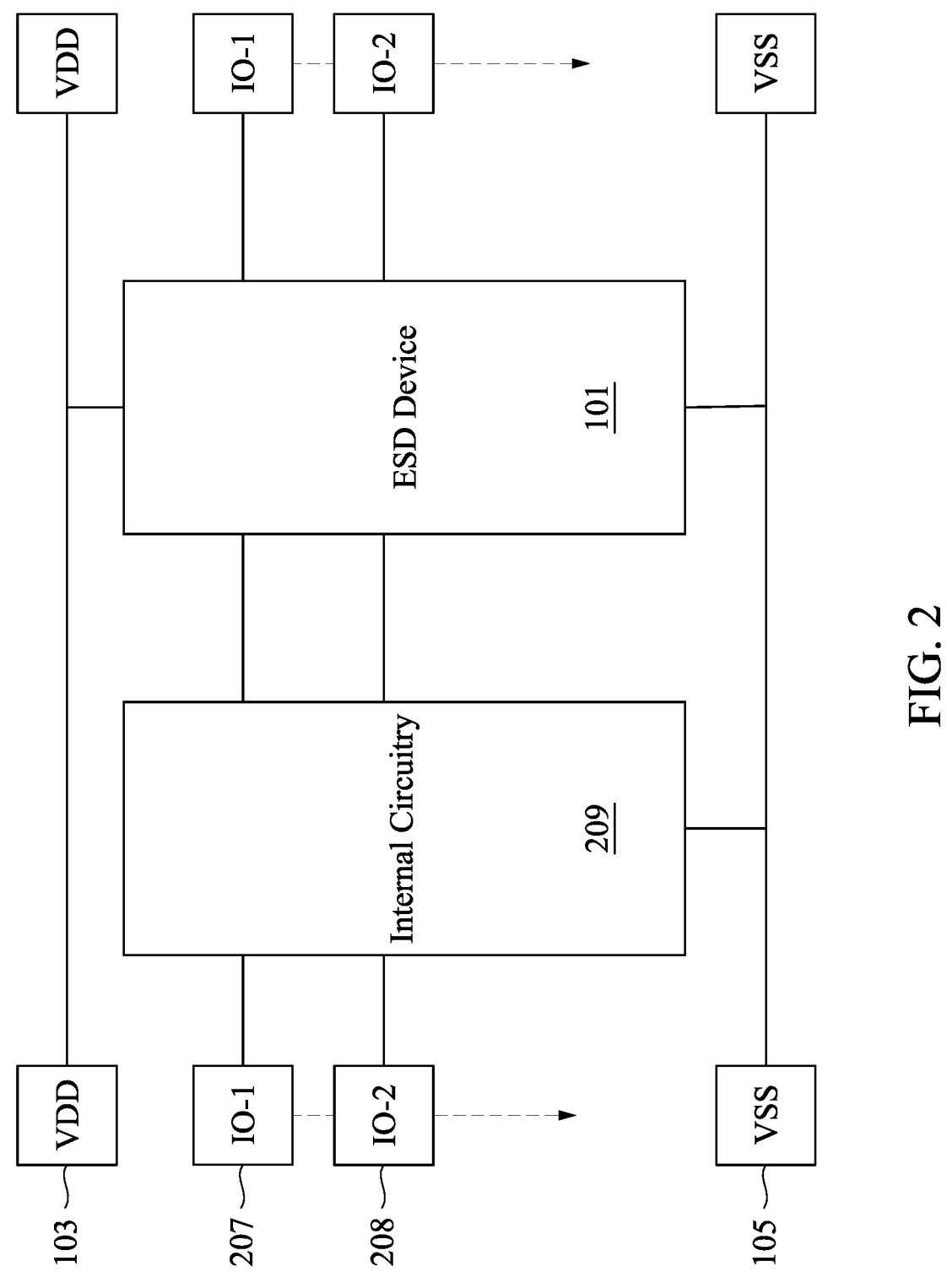
FIG. 2 is a block diagram depicting an ESD device that includes internal circuitry, I/O connections, and VDD/VSS connections in accordance with an embodiment.

FIG. 2 is a block diagram depicting a ESD Failsafe I/O circuit 200 that includes one or more I/O connections with internal circuitry and power lines in accordance with an embodiment. The example ESD Failsafe I/O circuit 200 includes an internal circuitry 209 that is connected to the ESD device 101, a positive voltage line (VDD) 103, and a ground or negative voltage line (VSS) 105. The internal circuitry 209 is configured with pins to accept I/O signals. The ESD device 101 is configured to clamp the voltage of the internal circuitry 209 through to power lines 103, 105. The ESD device 101 may also be connected to one or more I/O pins 207, 208. The ESD device 101 is configured for power to travel through an ESD path from the internal circuitry 209 through the ESD device 101 to either VDD 103 or VSS 105. During normal operations, the ESD device is configured to be turned off. When the voltage measured from the input of the internal circuitry 209 or I/O pins 207, 208 exceeds a designed voltage threshold, the ESD device 101 is turned on and voltage is clamped to a holding voltage as current flows from I/O pins 207, 208 through the ESD device 101 to VSS 105. This form of voltage clamping by pulling current through the ESD device 101 to VSS 105 is referred to as pull to VSS 105 mode (PS mode). When the voltage measured from the input of the internal circuitry exceeds a greater threshold the ESD device operates in pull-to-VDD mode (PD mode) and current flows from I/O through the ESD device to VDD 103. Generally, during PD mode current flows to both VDD 103 and VSS 105 as power is dissipated.

ESD devices 101 have design windows between the operating voltage of the circuitry and the voltage which would be destructive to internal components. An ESD device configured to direct current from I/O to VSS 105, or PS mode, may operate as a first breakdown protection for lower voltage ESD events. An ESD device configured to direct current from I/O to VDD 103, or PD mode, may operate as a worst case scenario when a higher voltage ESD event occurs. Example ESD devices may include a snapback device or 3-diode stack.

For example, a snapback device may be used as an ESD device 101 and/or a component in the ESD current path. A snapback device is a voltage clamping device with high resistance up to a breakdown voltage, or turn on point, above which the resistance drops dramatically. At the turn on point the device conducts electricity to reduce the voltage at a specific point to a holding voltage and allow current to flow across the transistor to a power rail. Generally a snapback device is designed to turn on and dissipate power prior to a voltage damaging to internal components, but remain at a high resistance state when the voltage is within normal operating voltage ranges. A snapback device is generally connected in series from I/O 207, 208 to VSS 105 with a power clamp connected in series from VSS 105 to VDD 103. A snapback device may require an extended drain region which may be larger than desired. Additionally, devices may have parasitic resistances associated with the drain region. The snapback device is turned on by the parasitic path which may be difficult to design for in complex designs.

A three diode stack is a design that could be used as an ESD device connected between I/O pins 207, 208 and VSS 105. A three diode stack is three diodes configured in series. These operate such that current flows through the diodes when the voltage differential of all three of the diodes is exceeded between the I/O pins 207, 208 and VSS 105. A three diode stack generally has high operating resistance due to the internal resistance of the diodes. In order to reduce operating resistance diode stacks require a large area. Additionally, in a three diode stack an pull-up diode is generally required between VSS 105 and I/O pins 207, 208.

An ESD failsafe device 101 is designed to prevent circuitry components from damage due to excess power associated with ESD events. The device is designed such that it does not interfere with operation of internal circuitry 209 when voltage at its input is within operational boundaries associated with the I/O pins 207, 208 or internal circuitry 209. Failsafe I/O devices 101 operate to protect internal circuitry 209 from ESD surges associated with I/O connections 207, 208. For example, a voltage surge may occur on an input due to external failures which may damage the internal circuitry 209 if power is not dissipated or redirected. When power is dissipated across a diode there is a temperature increase which may result in thermal challenges. Further, ESD devices operate within a design window to hold voltage prior to a breakdown voltage, but not clamp voltage when it is within the operational design. In this way, a reduced voltage drop across an ESD device allows for a larger design window or greater design voltages and current limits associated with the I/O and internal circuitry connections. Further, ESD devices require layout area on its associated component (such as an integrated circuit) which has associated costs. Generally it is difficult to control area and voltage drop during ESD design.

Fail-safe I/O PD mode voltage drop can be successfully reduced because it can directly turn on by pull-up diode instead of pull-down diode and power clamp body diode. This permits an expanded design window through direct connection to the positive voltage line VDD 103 without resistive losses associated with a power clamp. Further, the pull-up diode and pull-down diode may be placed on a separate cell which redirects power for multiple I/O connections. This shared ESD protection on a single ESD device reduces layout area requirements. Further, layouts within this embodiment permit both the pull-down diode and the pull-up diode to be configured over a shared deep N-well further reducing layout area.

Figure 3:
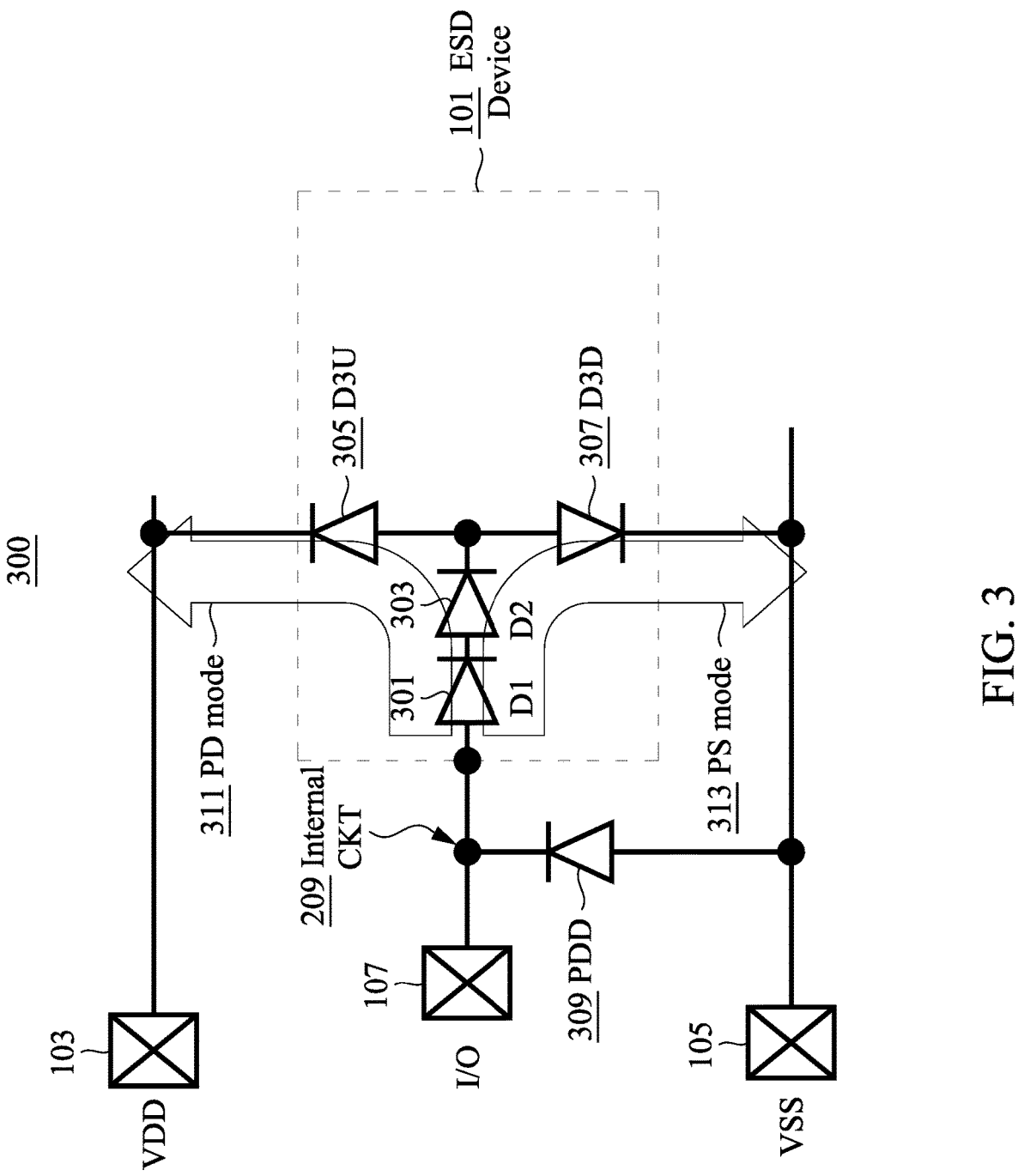
FIG. 3 is a diagram of an example power management circuit for a failsafe ESD protection device in an embodiment.

FIG. 3 is a diagram of an example power circuit 300 for a failsafe I/O ESD circuit in accordance with an embodiment. The ESD protection circuit 300 is an example embodiment of the ESD circuit 200 as diagramed in FIG. 2. The example ESD protection circuit 300 includes I/O connections 107, power line connections 103, 105, internal circuitry 209, a pull-down diode (PDD) 309, first pull-up diode (D1) 301, a second input diode (D2) 303, a third pull-up diode (3DU) 305, and a third pull down diode (D3D) 307. In this embodiment, the ESD device 101 refers to first pull-up diode (D1) 301, the second input diode (D2) 303, the third pull-up diode (3DU) and the third pull down diode (D3D) 307. This ESD device 101 operates to protect the internal circuitry 209 from ESD through I/O pins 107 or to protect other circuitry through the I/O pins 107. The internal circuitry 109 is connected to the external I/O pins 107, the pull-down diode (PDD) 309, and the first pull-up diode (D1) 301 of the ESD device 101.

The pull-down diode (PDD) 309 is connected such that current flows from the negative supply voltage or ground, e.g., VSS 105, through the pull-down diode 309 (PDD) to the internal circuitry 209. The pull-down diode 309 (PDD) may be configured such that the cathode side is connected between the I/O pin 107 and the internal circuitry 209 and the anode side is connected to the negative supply voltage line VSS 105. This pull-down diode 309 (PDD) may, for example, be a zener diode such as a transient-voltage-suppression (TSV) diode. This diode operates to prevent abnormal voltage ESD from entering through I/O into the internal circuitry. During an ESD event, the pull-down diode 309 (PDD) may operate in reverse to the input power that would otherwise flow into the internal circuitry 209.

This embodiment includes a PS mode path which includes current flowing out from the internal circuitry or I/O pins 107 through D1 301, then through D2 303, through D3D 307, to VSS 105. During general operations the voltage on the internal circuitry and I/O pins is less than the voltage at VSS plus the voltage drop at the three diode 301, 303, and 307 (D1, D2, and D3D) and thus the PS mode path does not have current flowing, also referred to as an off state. The current of an ESD event is redirected, for purposes of the PS mode path, when the voltage at the I/O pin 107 or internal circuitry 209 connection exceeds the voltage at VSS plus the voltage differential of D1 301, D2 303, and D3D 307; known as the threshold voltage. The PS mode ESD path is generally active during the PS mode ESD event to reduce the measured voltage on the I/O pin 107 or internal circuitry 209 connection to a holding voltage. The value of the threshold and holding voltage are determined by the designed electronic characteristics of D1 301, D2 303 and D3D 307 and the voltage of the negative voltage line VSS 105, which is generally zero as ground. Some electric characteristics are designed for the voltage drop across the diode, or the forward voltage when the diode is forward biased, and the operating resistance of the diode.

This embodiment further includes a PD mode path which includes current flowing out from the internal circuitry 109 or I/O pins 107 through D1 301, then through D2 303, through D3U 305, to VDD 103. During general operations the voltage on the internal circuitry and I/O pins is less than the voltage at VDD and thus the PD mode path does not have current flowing, also referred to as an off state. The current of an ESD event for purposes of the PD mode path is redirected when the voltage at the I/O pin or internal circuitry connection exceeds the voltage at VDD plus the voltage differential of D1 301, D2 303, and D3U 305; known as the threshold voltage. Since VDD voltage is greater than VSS voltage the voltage threshold for a PD mode ESD event is greater than that of a PS mode ESD event. Further, general during a PD mode ESD event power is dissipated across the diodes and to VDD as well as flowing through D3D 307 to VSS. The PD mode ESD path is turned on during the PD mode ESD event to reduce the measured voltage on the I/O pin 107 or internal circuitry 209 connection to a holding voltage. The value of the threshold and holding voltage are determined by the designed electronic characteristics of D1 301, D2 303 and D3U 305 and the voltage of the positive voltage line VDD 103.

The internal circuitry 209 has connections to at least one I/O through an I/O pin 107. Generally, internal circuitry would be connected to multiple inputs, I/O pins 207, 208 (IO-1, IO-2) which may send signals to the internal circuitry. Further, the internal circuitry would be connected to outputs which may be connected through the ESD device 101. In an example ESD event voltage on the I/O pin 107 may exceed a voltage threshold which is set to protect internal circuitry components with component that may be damaged if voltage or current maximums are exceeded. During the ESD event, voltage is redirected through the ESD device through a series of diodes which dissipate the power and direct power to the power lines (VDD 103, VSS 105). The ESD device 101 may be connected such that the measured voltage for turning on the ESD device is measured on either the internal circuitry 209 or the I/O pin 107.

In embodiments, a 3-diode stack design is configured such that power is dissipated through a series of diodes before flowing to a power line. A diode stack configuration clamps voltage once it reaches a threshold voltage of the voltage line plus the voltage drop on the diodes. A diode stack is not turned on by a parasitic resistance path and thus is more easily implemented in complex designs. The diodes may be tuned, based on voltage drop design, for a specific holding voltage that is not turned on during normal operation of the internal circuitry, but turns on during ESD events as a fail-safe to redirect power which would otherwise exceed the component specifications of the internal circuitry. Diode stacks have large operating resistance, or turn on resistance, and thus generally have large layout area requirements. Thus configurations which permit shared diodes are beneficial for reducing layout area restrictions while allowing for voltage drop control.

Figure 4A:
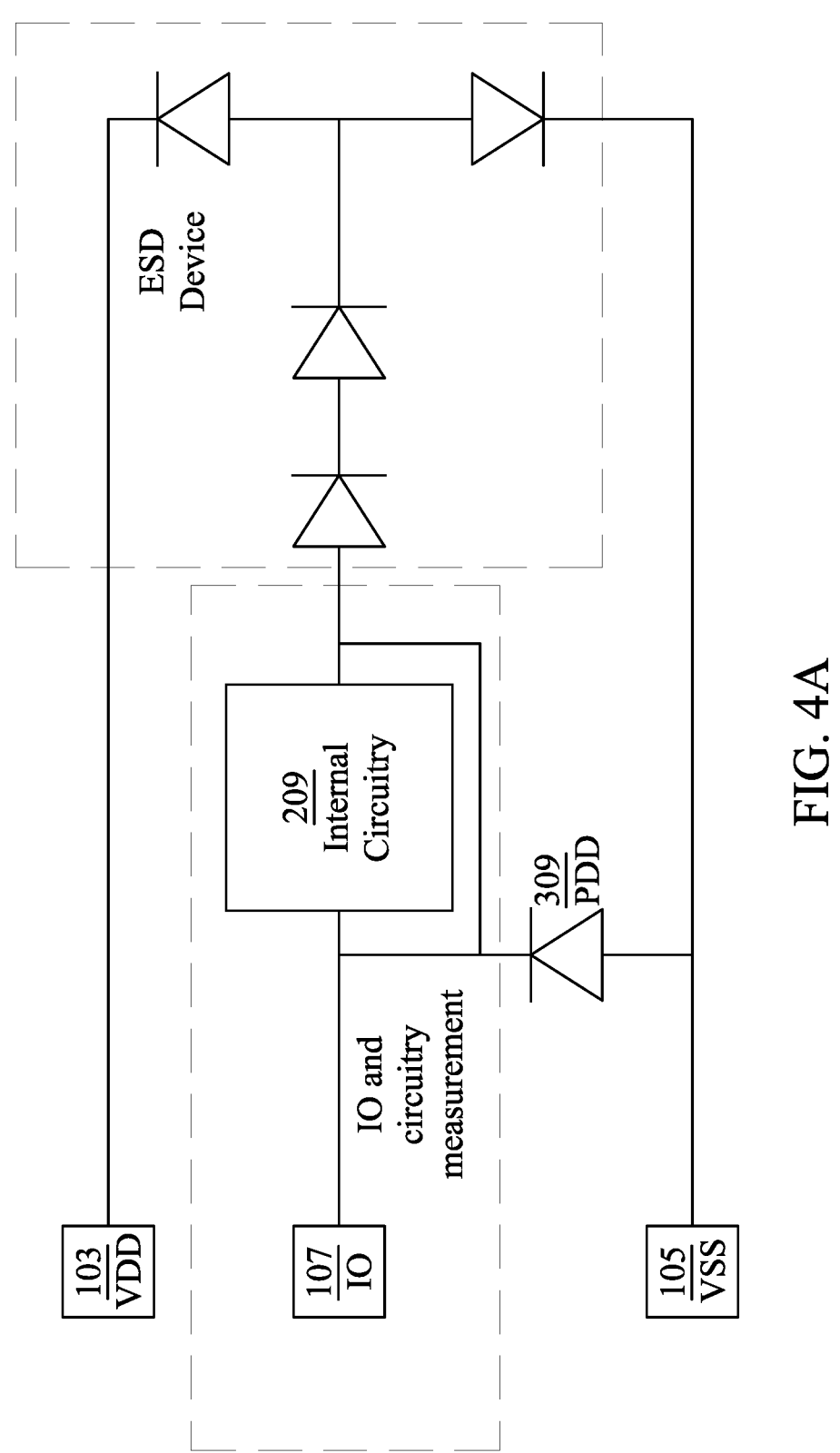
FIG. 4A depicts a circuit logic of an example power management circuit for a failsafe ESD protection device in an embodiment.
Figure 4B:
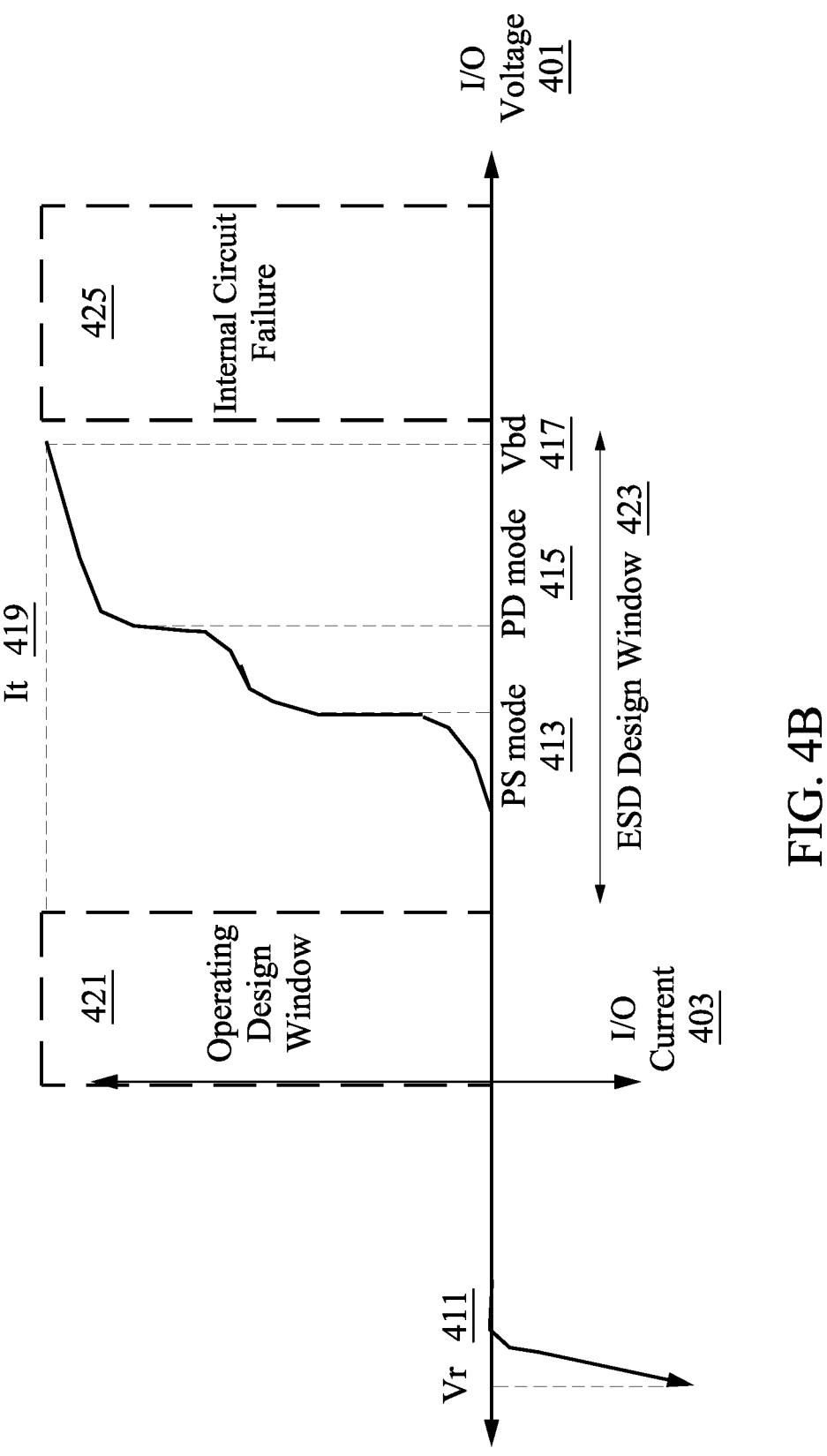
FIG. 4B depicts a power diagram showing an example operation of the power management circuit of FIG. 3 in an embodiment.

FIG. 4A is a diagram of an example power circuit 400 for a failsafe I/O ESD circuit in accordance with an embodiment with an accompanying power diagram FIG. 4B showing an example operation of the power management circuit of FIG. 4A in an embodiment. With reference to FIG. 4A, The pull-down diode (PDD) 309 is connected such that during forward operation current flows from the negative supply voltage or ground (VSS) 105, through the pull-down diode (PDD) 309 to the internal circuitry 209. This is generally off during operations as VSS 105 will have a lower voltage than the I/O pin 107 and internal circuitry 209 connections on the cathode side of the diode. This pull-down diode (PDD) 309 may, for example, be a zener diode such as a transient-voltage-suppression (TSV) diode. This diode operates to prevent abnormal voltage ESD from entering through I/O into the internal circuitry. Further, a negative voltage reading on I/O pin 107 would allow current to flow in a forward biased manner through the PDD 309 and prevent unanticipated voltage, such as an ESD event, from damaging internal circuit. During an ESD event, the PDD 309 may operate in reverse to dissipate the input power and transfer the power to ground, VSS 105, that would otherwise flow into the internal circuitry 209.

With reference to FIG. 4B the threshold voltage causes the voltage on the circuit to clamp at a PS mode voltage 413 and a PD mode voltage 415 in accordance with an embodiment. The voltage at the measured I/O connection 401 (I/O voltage) is expressed as the x-axis on the graph and the current across the ESD device 403 (I/O current) is represented as the y-axis. The reverse voltage is held a holding voltage 411 (Vr) by the PDD 309 associated with an I/O. The forward voltage has two holding voltages associated with the PD mode 311 and PS mode 313 operations of the ESD device 101. Once the voltage reaches the first threshold voltage 413 (PS mode) the voltage is held resulting a vertical slope in the power graph. This expresses the current that is redirected to VSS 105 and dissipated across the diodes when the ESD device is operating in PS mode. Further, the circuit has a second threshold voltage 415 (PD mode) in which the voltage is clamped at a higher voltage threshold. This represents the emergency second power mode which directs current to the positive voltage line VDD 103 and dissipates power over the diodes. During PD mode current may also flow through the pull-down diode to VSS 105.

There is a current threshold 419 (It) at which point the ESD device 101 cannot further clamp the voltage and voltage at the I/O exceeds the breakdown voltage 417 (Vbd) design which may result in damage to the internal circuitry 425. This is the failure point of the ESD device 101. The general operating voltage of the circuit involves I/O voltages between the two power rails 103, 105 (VDD and VSS). In this embodiment VSS 105 is ground and thus operation occurs between VSS 105 at zero volts and VDD 103 as the positive voltage rail. During general operating of the circuit the ESD device current is zero as the device is in an off state. The operational ESD design window 423 of the ESD device 101 is the voltage between the threshold voltage to turn on the ESD device 101 and the breakdown voltage 417 (Vbd) of the device. The first holding voltage, PS mode voltage 413, may be calculated as the voltage drop of the three diodes D1 301, D2 303, and D3D 307 plus the voltage at VSS 105 which is generally zero. The second holding voltage, PD mode voltage 415, may be calculated as the voltage drop of the three diodes D1 301, D2 303, D3U 305 plus the voltage at VDD 103. Therefore in some embodiments the voltage difference between the first holding voltage 413 and the second holding voltage 415 is approximately the same as the voltage differential between VDD 103 and VSS 105.

Figure 5:
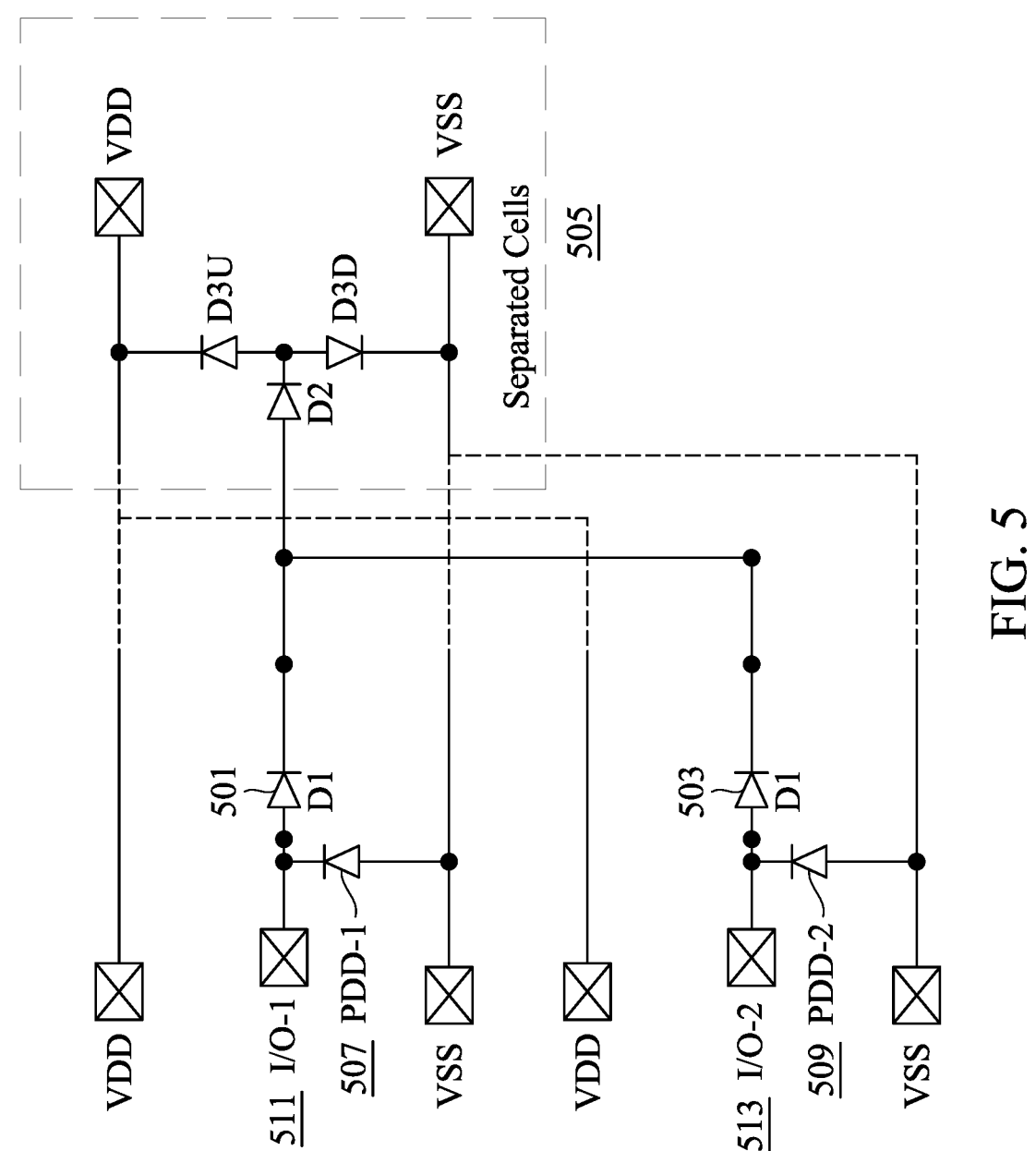
FIG. 5 depict another example power management circuit for a failsafe ESD protection device in an embodiment.

FIG. 5 is another example power management circuit 500 for an ESD I/O failsafe with multiple I/O connections. The circuit layout includes multiple connections to a positive voltage rail VDD 103, and a negative voltage rail VSS 105, a connection to a first input/output 511 (I/O-1), a second input/output 513 (I/O-2), and a series of diodes. In this embodiment, the second input diode 303 (D2), the third pull-up diode 305 (D3U) and the third pull-down diode 307 (D3D) are configured on separated cells 505 such as an ESD fail-safe cell. The ESD device 101 includes the input diode 303 (D2), the third pull-up diode 305 (D3U) and the third pull-up diode 307 (D3D). The ESD device 101 may be multiple separated cells or a single ESD fail-safe cell. The ESD device 101 is configured to take inputs from I/O-1 511, I/O-2 513, VSS 105, and VDD 103. The ESD device 101 is configured with I/O-1 511 and I/O-2 513 connected to the anode side of the second input diode 303 (D2). The cathode side of the input diode 303 (D2) is connected to the anode sides of the third pull-up diode 305 (D3U) and the third pull-down diode 307 (D3D). The third pull-down diode 307 (D3D) is configured with its anode connected to the cathode side of the input diode 303 (D2) and its cathode side connected to the negative voltage line 105 (VSS), which is generally ground.

Each I/O has its own pull-down diode 507, 509 (PDD-1 and PDD-2) which is connected with its anode side connected to VSS 105 and its cathode side connected to the respective I/O pin 511, 513 (I/O-1 and I/O-2). These pull-down diodes 507, 509 (PDD-1 and PDD-2) operate to clamp each input/output such that current may flow in reverse through the pull-down diode. These pull-down diodes 507, 509 (PDD-1, PDD-2) may, for example, be a zener diode such as a transient-voltage-suppression (TSV) diode. This diode operates to prevent abnormal power from an ESD event from entering through I/O into the internal circuitry. During an ESD event, the pull-down diodes 507, 509 (PDD-1 and PDD-2) may operate as reverse-biased to redirect the power that would otherwise flow into the internal circuitry 209.

Each I/O has its own pull-up diode D1 (501, 503) connected with its anode side connected to the respective I/O pin connection (I/O-1, I/O-2) 511, 513 and its cathode side connected to the anode side of the input diode (D2) 303. These diodes operate to form a three-diode string along either the PS mode ESD path or the PD mode ESD path.

In this manner the second input diode, the third pull-up diode, and the third pull-down diode can be configured on separated cells 505. These separate cell 505 can protect multiple I/O cells by turning on from an ESD event associated with any connected IO, for example I/O-1 or I/O-2 (511, 513). Further, this embodiment preserves layout area by sharing diodes among different I/O and internal circuitry connections. As further described in other embodiments the pull-up diode and pull-down diode on the separate cell may share a layout configuration over a shared deep n-well. Therefore, this configuration preserves layout area and permits a larger ESD design window 423 for more robust ESD protection.

Figure 6:
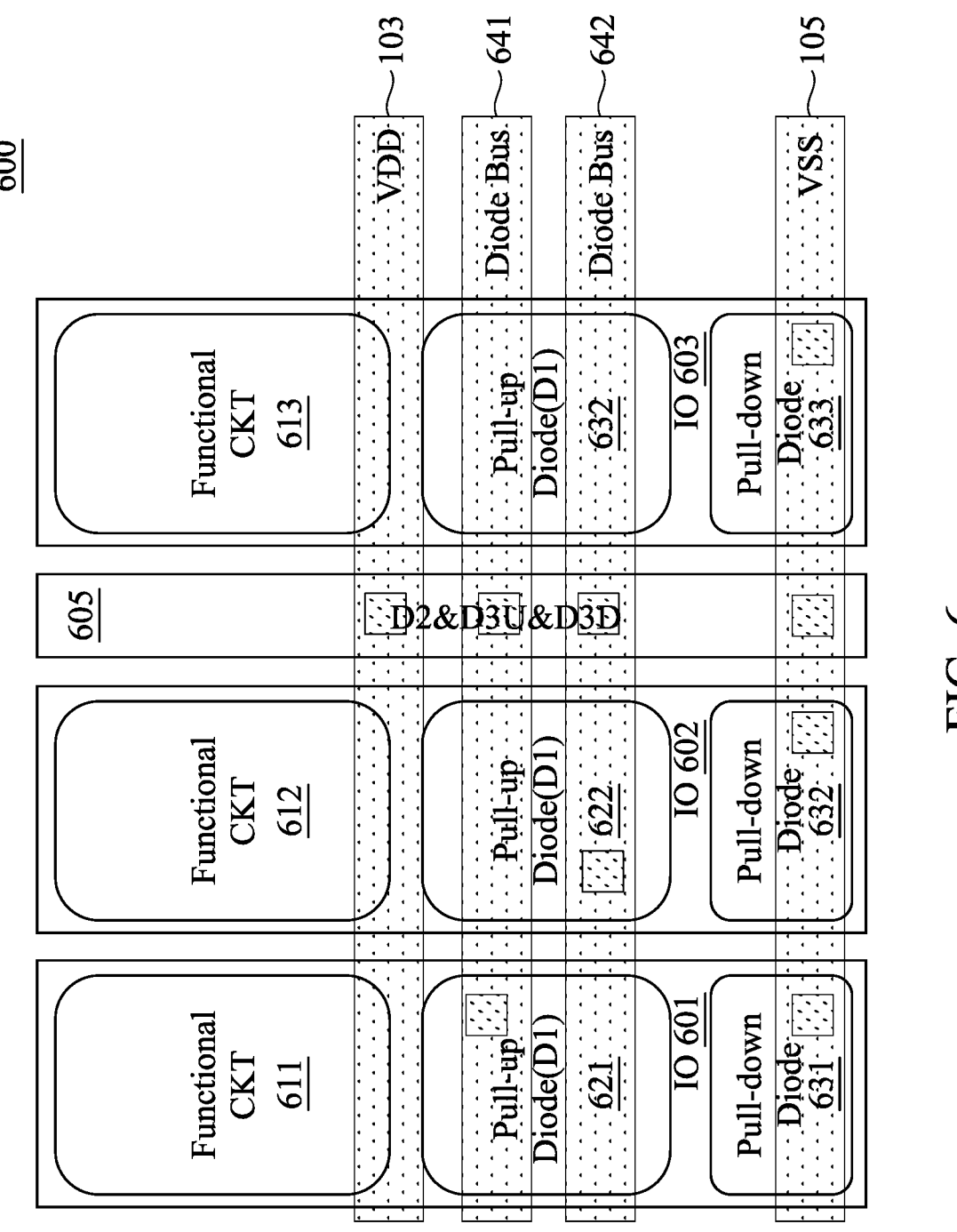
FIG. 6 depict a bus diagram for the power management circuit of FIG. 5 in an embodiment.

FIG. 6 is a bus diagram of the failsafe I/O power management circuit 600 in accordance with an embodiment. The example 600 shown in FIG. 6 is the same as the example power management circuit in FIG. 5, except that the example shown in FIG. 6 is portrayed as a bus layout and includes an additional I/O connection. The example layout of the failsafe I/O power management circuit 600 includes three I/O cells 601, 602, 603 and a failsafe ESD protection cell 605. The cells may be configured with cells in any order or with cells configured in perpendicular. This embodiment places the cells in parallel for clarity and simplicity to exemplify multiple I/O structures in connection with a shared failsafe ESD protection cell. In other embodiments cells may be configured for efficiency or to meet component specifications. The example bus layout further includes a VDD power rail 103, a VSS power rail 105, a first diode bus 641, and a second diode bus 642.

In this example embodiment layout each I/O cell 601, 602, and 603 includes respective functional circuits 611, 612, and 613. These circuits may, for example, be the internal circuitry 209 in FIG. 2 that is protected by the ESD device 101. The first I/O cell 601 includes a pull-down diode 631, a pull-up diode 621 (D1), and the functional circuitry 611. The first I/O cell 601 is connected to the failsafe ESD protection cell 605 in an ESD path including, the pull-up diode 621, the first diode bus 641, and the ESD protection cell 605. With reference again to FIG. 5, the ESD protection cell 605 may, for example, be configured such that the first diode bus 641 is connected to the input diode 303 (D2) and then to the third pull-up diode 305 (D3U) and the third pull-down diode 307 (D3D). The first I/O cell 601 also includes a connection to VSS 105 through the pull-down diode 631 and may include connections to VDD to power the function circuit 611. The first I/O cell 601 connection through the pull-up diode 621, 501 (D1) may be the first input/output pin 511 (I/O-1) from which voltage is measured by the ESD device 101 for I/O protection.

The second I/O cell 602 includes a pull-down diode 632, a pull-up diode 622 (D1), and functional circuitry 612. The second I/O cell 602 is connected to the failsafe ESD protection cell 605 in an ESD path including, the pull-up diode 622, the second diode bus 642, and the ESD protection cell 605. Similar to the first I/O cell 601, the second I/O cell 602 may include connection the second input/output pin 513 from which voltage is measured by the ESD device for I/O protection.

The third I/O cell 603 includes a pull-down diode 633, a pull-up diode 632 (D1), and functional circuitry 613. The third I/O cell 603 may be configured similarly to the first I/O cell 601 and the second I/O cell 602 with connections to VSS 105, VDD 103, and either the first diode bus 641 or the second diode bus 642. The failsafe ESD path is configured such that the first diode bus 641 or the second diode bus 643 is connected to the pull-up diode 632, and into the failsafe ESD protection cell 605.

Figure 7B:
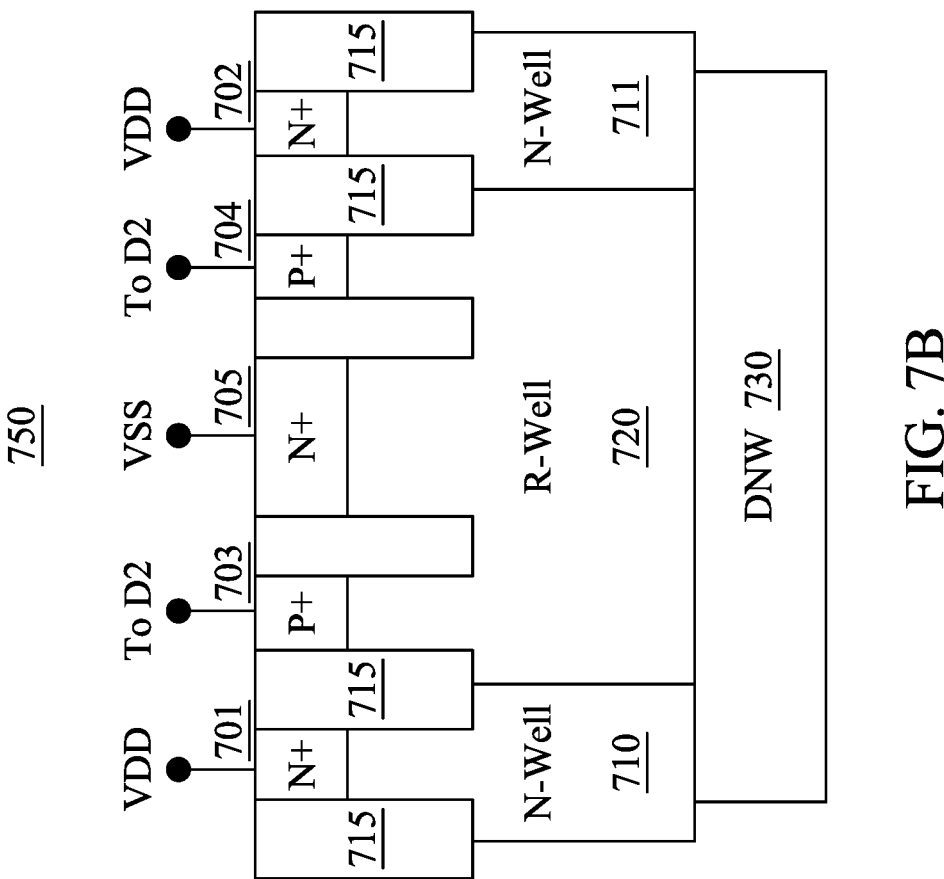
FIGS. 7A-7B depict a circuit logic diagram and cross-sectional layout of a failsafe ESD protection device in an embodiment.
Figure 7A:
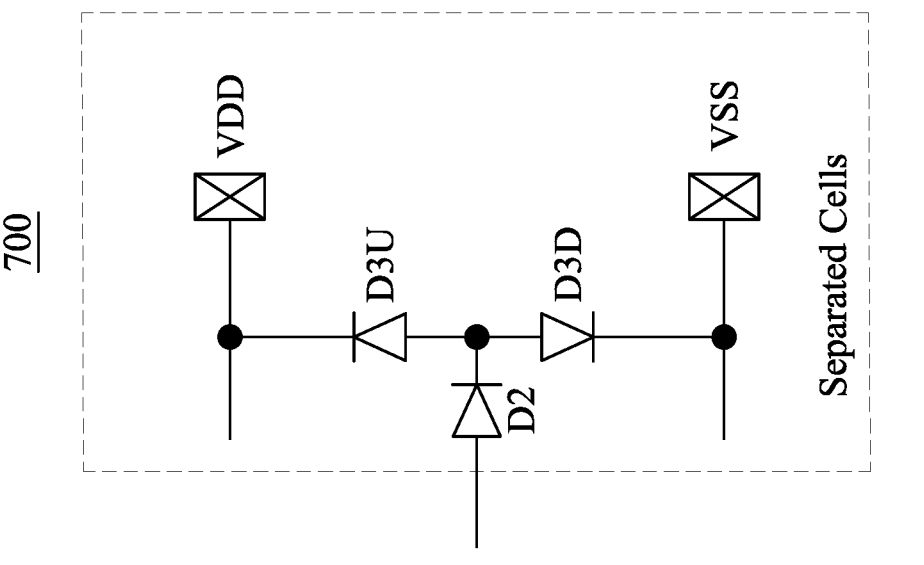

FIGS. 7A-7B depict another example failsafe ESD protection cell for a failsafe ESD protection device in an embodiment. The example failsafe ESD protection cell 700 shown in FIG. 7A is the same as the example separated cells 505 in FIG. 5. In this embodiment the separated cells 505 are a single ESD protection cell, such as the ESD protection cell 605 as shown in FIG. 6. The example shown in FIG. 7B is the same as the ESD protection cell 605 as shown in FIG. 6, except that in the example shown in FIG. 7B the ESD protection cell 605 is displayed as a cross-sectional doping layout 750. The example cross-sectional layout 750 is identical to the logic layout of the failsafe ESD protection cell 700 in FIG. 7A. The failsafe ESD device layout includes a deep N-well 730 (DNW), two N-wells 710, 711, an R-well 720, two N+ nodes 701, 702, two P+ nodes 703, 704, and connections to VDD 701, 702, D2 703, 704, and VSS 705.

In a diode current flows from the anode to cathode direction during forward bias operations. Thus a p-n junction is formed between the P+ nodes 703, 704 and the N+ nodes 701, 702, 705 such that multiple diodes are formed in the layout. The third pull-down diode (D3D) is formed from both P+ nodes 703, 704 connected to the input diode (D2), through the R-well 720, to the N+ node 705 connected to VSS. The third pull-up diode (D3U) is formed from the P+ nodes 703, 704 through the R-well and the respective N-well 710, 711 to the N+ nodes 701, 702 connected to VDD. The two N-wells 710, 711 and the R-well 720 are formed on top of the deep N-well 730 (DNW). A buffer 715 exists between each of the nodes 701, 702, 703, 704, 705 which is generally an insulating oxide to force the majority of current to flow through the N-wells 710, 711 and R-wells 720. This results in designs with accurate and intended diode characteristics due to minimal parasitic capacitance.

Figure 8A:
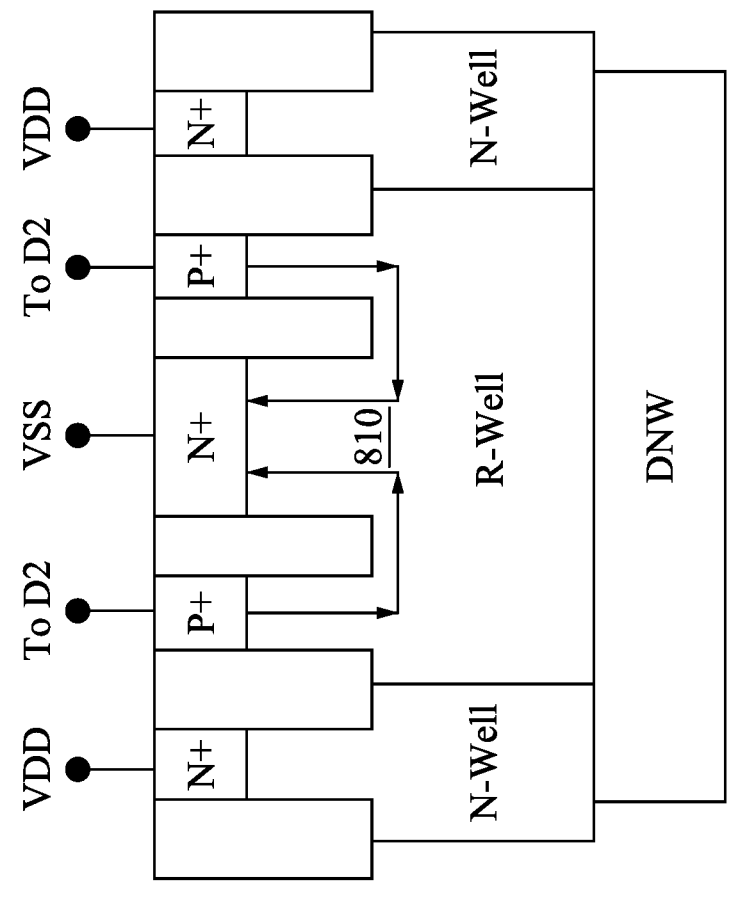
FIGS. 8A-8B depict ESD path diagrams for the power management circuit of FIG. 7 in an embodiment.
Figure 8A:
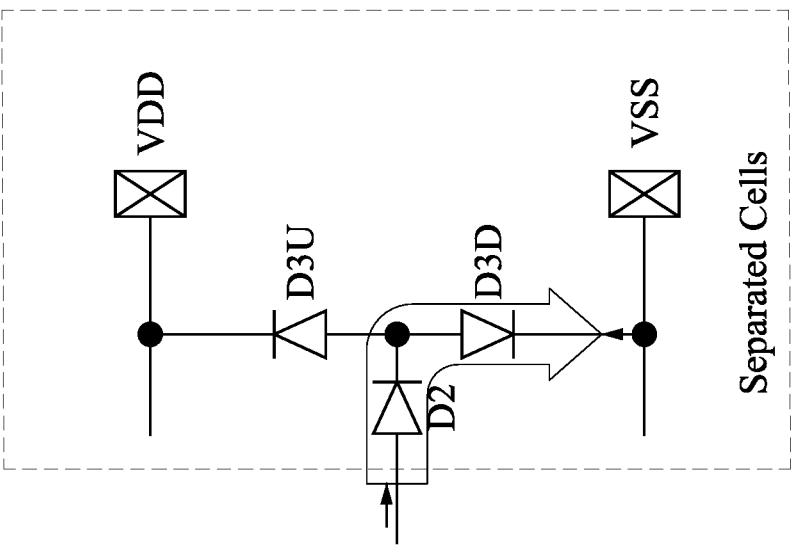
Figure 8B:
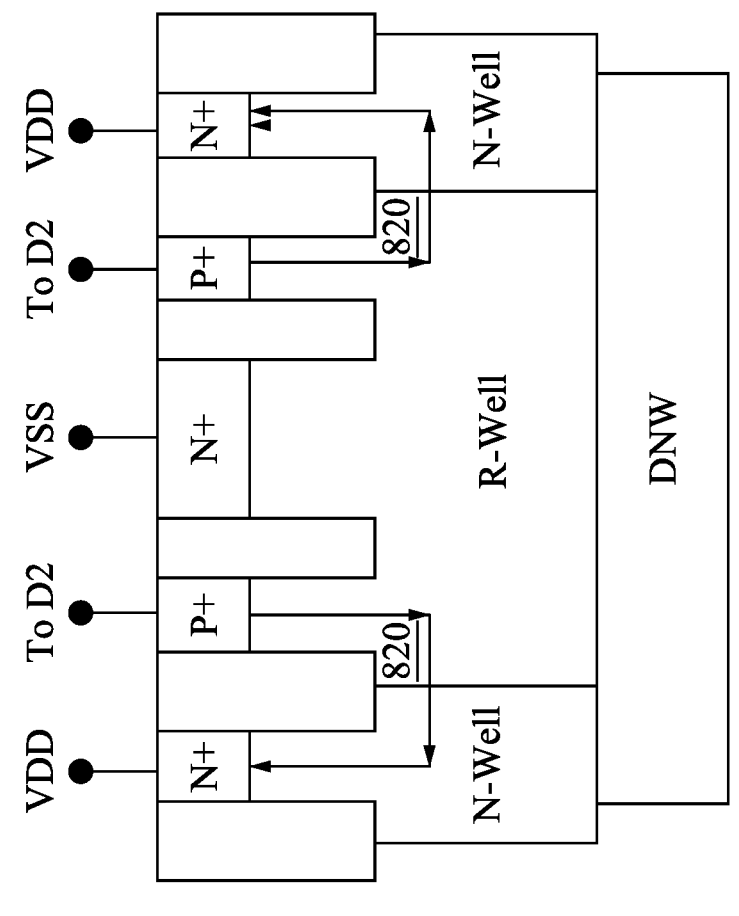

FIGS. 8A and 8B are another example layout distribution for the power management circuit of FIGS. 7A and 7B in accordance with an embodiment. FIGS. 8A and 8B display the shared diode operations of the failsafe ESD protection cell. In FIG. 8A current flows from the D2 node at P+ nodes 703, 704, through the R-well 720 and into the N+ node 705 at VSS 810. This configuration forms the third pull-down diode 307 (D3D) as part of the PS mode path. In FIG. 8B current flows from the D2 P+ nodes 703, 704, through the R-well 720 and the N-wells 710, 711 into the N+ nodes 701, 702 at VDD 820. This configuration forms the third pull-up diode 305 (D3U) as part of the PD mode.

In a diode current flows from the anode to cathode direction during forward bias operations. The diode includes a P-type and an n-type component such that a p-n junction is formed such that the device operates as if resistance is very low from anode to cathode but very high from cathode to anode. Thus, in FIG. 8A current is flowing in the PS mode path through the input diode 303 (D2) into the separated cell layout 750 at the P+ nodes 703, 704 through the R-well to the N+ node 705 connected to VSS 810, which forms the third pull-down diode 307 (D3D). In FIG. 8B the example layout is operating in PD mode such that current is flowing along the PD mode path 820. During PD mode current flows through the PD mode path through the input diode 303 (D2) into the P+ nodes 703, 704 through the R-well 720, through the N-wells 710, 711 into the N+ nodes 701, 702 connected to VDD 820, which forms the third pull-up diode 305 (D3U).

Figure 9A:
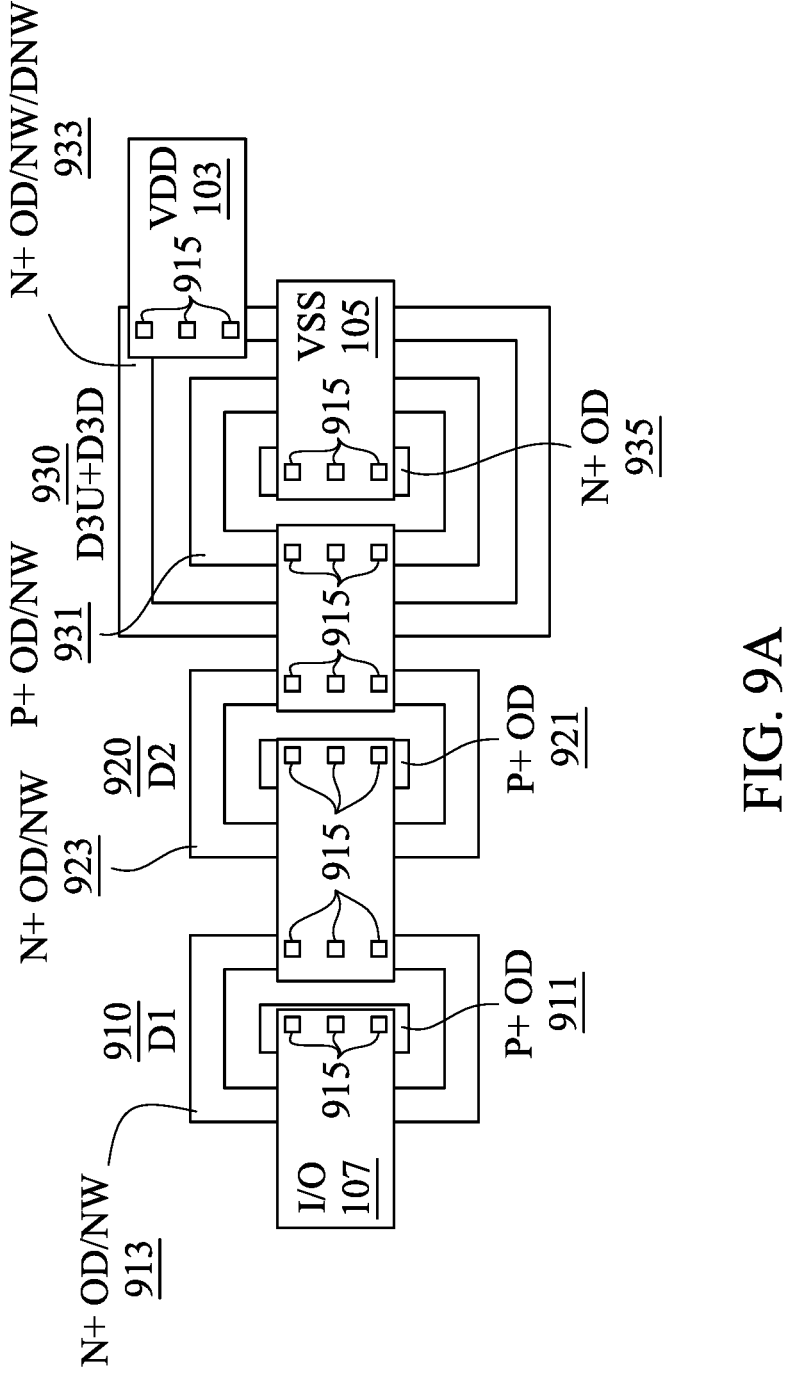
FIGS. 9A-9B are additional example layout distributions for the power management circuit of FIG. 7 in an embodiment.
Figure 9B:
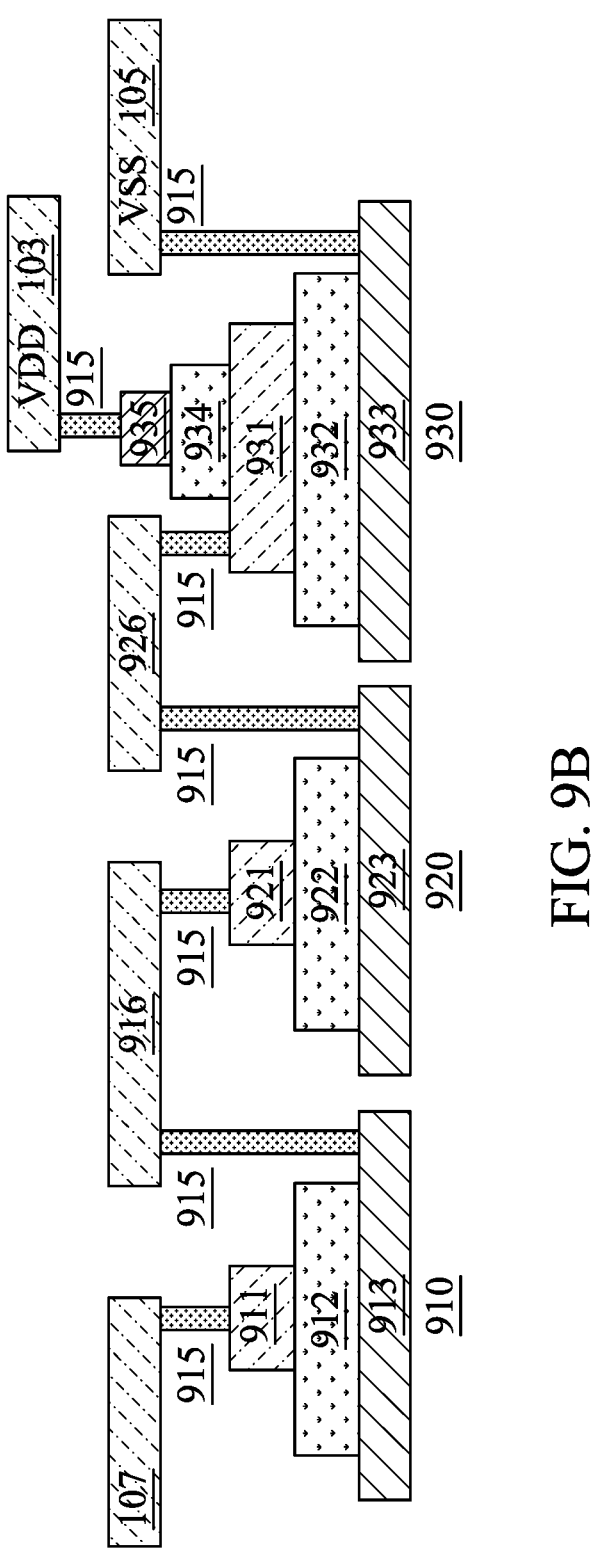

FIGS. 9A-9B are additional example layout distributions for the power management circuit of FIG. 7 in accordance with an embodiment. FIG. 9A is a top-down view of the doping layout for diodes in failsafe ESD protection cells. FIG. 9B is an example cross-sectional view of the doping layout of diodes in failsafe ESD protection cells.

The example layout distribution 900 includes a first diode layout 910 (D1), a second diode layout 920 (D2), and a third layout with shared diodes 930 (D3U+D3D). The first diode layout 910 (D1) includes connections to I/O 107, a P+ and oxide diffusion layer 911, a buffer layer 912, and an N+ oxide diffusion and N-well layer 913. The first diode layout 910 (D1) connects to I/O pads 107 through vias 915 which contact the P+ oxide diffusion layer 911. The first diode layout (D1) 910 connects to the second diode layout 920 (D2) through conductive vias 915 which connect the N+ oxide and N-well layer 913 to the P+ and oxide diffusion layer of the second diode layout 920 (D2).

The second diode layout 920 (D2) includes connections to the first diode layout 910 (D1), a P+ and oxide diffusion layer 921, a buffer layer 922, and an N+ oxide diffusion and N-well layer 923. The second diode layout 920 (D2) connects the first diode layout 910 (D1) through vias 915 which contact the P+ oxide diffusion layer 911. The second diode layout (D2) 920 connects to the third shared diode layout 930 (D3U+D3D) through conductive vias 915 which connect the N+ oxide and N-well layer 923 to the P+ oxide diffusion and R-well layer 931 of the third shared diode layout 930 (D3U+D3D). The connecting plate 916 between the first diode layout 910 (D1) and second diode layout 920

(D2) may be formed as a diode bus, for example, the first or second diode bus 641, 642 as shown in FIG. 6.

The third shared diode layout 930 (D3D+D3U) includes connections to the second diode layout 920 (D2), a P+ oxide diffusion and R-well layer 931, two buffer layers 932, 934, an oxide diffusion, N-well, and deep-N-well layer 933, and an N+ oxide diffusion layer 935. The third diode shared layout 930 (D3D+D3U) is connected to the second diode layout 920 (D2) through vias 915 which contact the P+ oxide diffusion and R-well layer 931. The third shared diode layout 930 (D3D+D3U) connects to the VDD power rail 103 through conductive vias 915 which contact the N+ oxide diffusion N-well and deep N-well layer 933. The third shared diode layout 930 (D3D+D3U) connects to the VSS power rail 105 through conductive vias 915 which contact the N+ oxide diffusion layer 935. The connecting plate 926 between the second diode layout 920 (D2) and second diode layout 916 may be formed as a diode bus, for example, the first or second diode bus 641, 642 as shown in FIG. 6. In other embodiments, the connecting plate 926 is formed as part of the same cell as the second diode layout 920 (D2) and the third shared diode layout 930 (D3U+D3D) such that no diode bus connects the two diode layouts.

Figure 10:
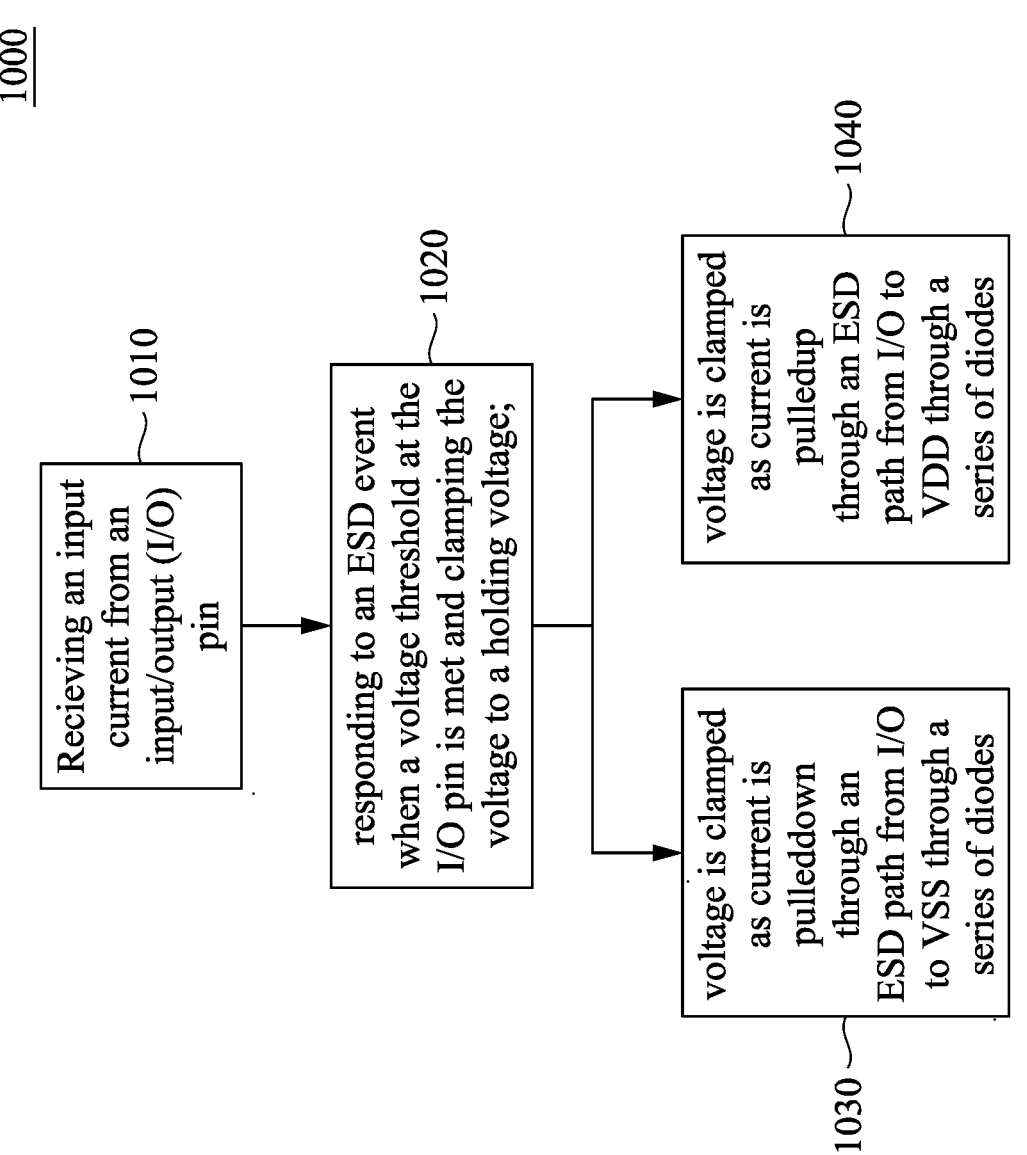
FIG. 10 is a flow diagram of an example method for failsafe operation of an ESD circuit in an embodiment.

FIG. 10 is a flow diagram depicting a method 1000 for protecting circuitry during an ESD event for a power circuit that includes a plurality of protected chips in accordance with an embodiment. The steps of FIG. 10 are provided with reference to previously described structures for ease of understanding, but it is understood that the steps could be performed using a variety of structures. The method 1000 may, for example, be performed by one of the example power management circuits 300, 400, 500, 600 in FIGS. 3, 4A, 5, and 6. The input current may be received 1010, for example, from the input/output pins 107, 511, 513. When a voltage threshold is reached at the I/O pin voltage is clamped to the first holding voltage 1020. When current at the input pin pushes input voltage to the threshold voltage an ESD event response redirects current 1020. During an ESD event voltage is clamped by the PD path as current is pulled down through an ESD path from I/O to VSS through a series of diodes 1030. If the current further pushes the voltage to a second threshold voltage the current may travel through an ESD path from I/O to VDD through a series of diodes 1040. This second path further clamps the voltage at a threshold voltage prior to a breakdown voltage and operates as fail safe to reduce the chance that voltage would exceed a breakdown voltage during an ESD event.

According to some embodiments, systems and methods are provided for a Failsafe ESD protection utilizing power control circuitry. In an example, the power circuit includes input/output pins, internal circuitry, and diode configurations for reducing power on internal circuitry. The ESD protection circuitry is configured to reduce voltage drop for greater design window. The circuitry reduces voltage drop through utilization of a three-diode string for each ESD path which does not require a voltage drop over a power clamp or snapback device. In this configuration a first diode and a second diode are connected in series to a third pull-up diode and a third pull-down diode. The third pull-up diode is connected from the output of the second diode and a VDD power rail. The third pull-down diode is connected from the output of the second diode and a VSS power rail. This embodiment may occupy less design layout area because the pull-up diode and the pull-down diodes may share a deep N-well. Further, design layout area may be reduced through configuring the second diode, the third pull-up diode and the third pull-down diode on a separate cell than an input/output or functional circuitry. This separate ESD cell may be connected multiple cells with protected circuitry and input/outputs that are each connected to the ESD cell for ESD protection. In this manner design area is reduced by protecting multiple cells through a shared ESD protection cell.

In an embodiment, an ESD protection circuit may operate as a failsafe through either a input/output (I/O) to VDD or an input/output to VSS modes. The method of protecting internal or functional circuitry through direct connection to both the VDD line and the VSS line permits ESD protection to be turned on without based on a voltage drop over the diodes. This does not require the use of a power clamp which generally reduces the voltage drop of the ESD protection. This further allows for a greater design window. Further, the method does not require a snapback device and therefore may be tuned based on diode voltage drop specifications without reliance on a parasitic resistance path to turn on. The ESD path from I/O to VDD is referred to as the PD mode path and operates as a most substantial power dissipation mode or last resort fail-safe operation to prevent circuitry from damage. The ESD path from I/O to VSS is referred to as the PS mode path and operates lower power dissipation mode for less severe ESD events. The power is dissipated through the diodes and power rails (VDD, VSS). The method practiced in this embodiment may be completed through a three-diode stack configuration where the third diode of the stack is either a pull-up diode for the PD mode path or a pull-down diode for the PS mode path. Further, the ESD fail-safe modes may be practiced for multiple I/O connections. Further the ESD fail-safe methods may be practiced on a separate ESD cell to preserve layout area.

In an additional embodiments, a failsafe ESD cell includes a first input diode, a second pull-up diode, and a third pull-down diode. The first input diode is configured between an I/O connection and the anode sides of the second pull-up diode and the third pull-down diode. The I/O connection is associated with the protected circuitry and the I/O pin voltage effects whether the ESD cell is operating or in an off state. Once a threshold voltage is reached on the I/O pin, current flows through the third pull-down diode and/or the second pull-up diode to separate power rails. The ESD cell may be configured over a shared deep N-well to reduce design area layout. Three-diode stacks may be configured through an additional pull-up diode connected in series with the anode side connected to the I/O and the cathode side connected to the anode side input of the input diode. This circuitry configuration permits input connections to the ESD cell from multiple I/O cells each with a pull-up diode and a pull-down diode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method comprising:
responding to an electrostatic discharge (ESD) event by clamping a voltage along an ESD path from an I/O pin of a plurality of I/O pins through a plurality of diodes, wherein shared diodes of the plurality of diodes are shared among the plurality of I/O pins, and the plurality of I/O pins are connected to a positive voltage source line through the shared diodes.

2. The method of claim 1, wherein the shared diodes include a first diode and a second diode in a first mode path.

3. The method claim 2, wherein the shared diodes further include a third diode and the first and third diodes are in a second mode path.

4. The method of claim 1, wherein the shared diodes are in a separate cell from the I/O pin.

5. The method of claim 1, wherein the shared diodes are in a separate cell from a diode of the plurality of diodes.

6. An electrostatic discharge (ESD) circuit comprising:
a plurality of cells extending along a first direction and arranged along a second direction transverse to the first direction;
a first diode in an input/output (I/O) cell of the plurality of cells; and
a second diode in an ESD cell of the plurality of cells,
wherein an I/O pin of the I/O cell is connected to a positive voltage source line through the second diode.

7. The ESD circuit of claim 6, wherein the ESD cell further includes third and fourth diodes.

8. The ESD circuit of claim 7, wherein the third and fourth diodes are in an N-well.

9. The ESD circuit of claim 7, wherein the second, third, and fourth diodes are connected to a plurality of I/O pins.

10. The ESD circuit of claim 6, further comprising a third diode connected between the first diode and a ground or negative voltage source line.

11. The ESD circuit of claim 6, wherein the ESD cell further includes a third diode connected to the first diode.

12. The ESD circuit of claim 6, wherein the ESD cell further includes a third diode connected between the second diode and the positive voltage source line.

13. The ESD circuit of claim 6, wherein the ESD cell further includes a third diode connected between the second diode and a ground or negative voltage source line.

14. The ESD circuit of claim 6, wherein the I/O cell further includes a circuit.

15. The ESD circuit of claim 14, wherein the circuit is connected between an I/O pin and the first diode.

16. An electrostatic discharge (ESD) circuit comprising:
an ESD cell including
a first diode,
a second diode connected between the first diode and a positive voltage source line, and
a third diode connected between the first diode and a ground or negative voltage source line, wherein the first and second diodes are configured to clamp a higher voltage than the first and third diodes, and a plurality of I/O pins sharing the ESD cell are connected to the positive voltage source line through the second diode.

17. The ESD circuit of claim 16, further comprising a fourth diode between an I/O pin and the first diode.

18. The ESD circuit of claim 16, further comprising an I/O cell connected to the ESD cell and including
a fourth diode connected between an I/O pin and the first diode,
a circuit connected between the I/O pin and the fourth diode, and
a fifth diode connected between the circuit and the ground or negative voltage source line.

19. The ESD circuit of claim 16, further comprising a circuit connected to the ESD cell and the ESD cell is configured to protect the circuit from ESD events at the plurality of I/O pins.

20. The ESD circuit of claim 19, further comprising a plurality of fourth diodes, each of which is connected between the ESD cell and a respective one of the I/O pins.

\*    \*    \*    \*    \*